(12) United States Patent
Schultz et al.

(10) Patent No.: US 7,308,627 B2
(45) Date of Patent: *Dec. 11, 2007

(54) SELF-TIMED RELIABILITY AND YIELD VEHICLE WITH GATED DATA AND CLOCK

(75) Inventors: Richard Schultz, Fort Collins, CO (US); Derryl Allman, Camas, WA (US); Jan Fure, Milwaukie, OR (US)

(73) Assignee: LSI Corporation, Milpitas, CA (US)

( * ) Notice: Subject to any disclaimer, the term of this patent is extended or adjusted under 35 U.S.C. 154(b) by 549 days.

This patent is subject to a terminal disclaimer.

(21) Appl. No.: 10/900,642

(22) Filed: Jul. 27, 2004

(65) Prior Publication Data

US 2005/0015651 A1 Jan. 20, 2005

Related U.S. Application Data

(63) Continuation-in-part of application No. 10/418,560, filed on Apr. 16, 2003, now Pat. No. 6,861,864.

(51) Int. Cl.
*G01R 31/28* (2006.01)

(52) U.S. Cl. .................... 714/724; 324/765; 324/158.1
(58) Field of Classification Search ...................... None
See application file for complete search history.

(56) References Cited

U.S. PATENT DOCUMENTS

| | | | | |
|---|---|---|---|---|
| 5,299,204 A | * | 3/1994 | Daniel | 714/724 |
| 5,674,651 A | * | 10/1997 | Nishi | 430/22 |
| 6,092,223 A | * | 7/2000 | Ahn | 714/711 |
| 6,436,741 B2 | * | 8/2002 | Sato et al. | 438/149 |
| 6,483,176 B2 | * | 11/2002 | Noguchi et al. | 257/666 |
| 6,707,064 B2 | * | 3/2004 | Jang et al. | 257/48 |
| 6,861,864 B2 | | 3/2005 | Schultz | |
| 6,885,950 B2 | | 4/2005 | Mitsutake et al. | |

* cited by examiner

*Primary Examiner*—Cynthia Britt
*Assistant Examiner*—Merant Guerrier
(74) *Attorney, Agent, or Firm*—Cochran Freund & Young LLC

(57) ABSTRACT

A test vehicle a system and method for evaluating an interconnect module manufacturing process while dynamically testing performance with high-speed operational frequencies is disclosed. The test vehicle incorporates a self-timed or gated speed circuit that can detect subtle resistive faults and also show the exact location in the array where the speed fault occurred based on test program data logs from scan flip flops. One embodiment incorporates a gated clock in the gated speed circuit producing gated data that delivers greater statistical properties with respect to Integrated Circuit Direct Drain Quiescent Current (IDDQ) testing.

28 Claims, 8 Drawing Sheets

SELF-TIMED RELIABILITY AND YIELD VEHICLE WITH GATED DATA AND CLOCK

CROSS REFERENCE TO RELATED APPLICATIONS

This application is a continuation-in-part of U.S. patent application Ser. No. 10/418,560 entitled "Self-Timed Reliability and Yield Vehicle" by Richard Schultz, filed Apr. 16, 2003 now U.S. Pat. No. 6,861,864, the entire contents of which is hereby specifically incorporated herein by reference for all it discloses and teaches.

BACKGROUND OF THE INVENTION a. Field of the Invention

The present invention pertains to integrated circuit manufacturing and specifically to test samples used to qualify a new manufacturing process.

b. Description of the Background

In the development of a new manufacturing process for integrated circuits (interconnect modules), certain design rules are created that define the capabilities of the process. A designer begins the design of new integrated circuits at the same time as the manufacturing capability is being developed. The concurrency of new process development and product design places great importance on the ability of the manufacturing process to be able to produce integrated circuits using those design rules.

The design rules include such things as minimum trace width, minimum distance between traces, the maximum number of vias that may be stacked on top of each other, and other such parameters. Typically, a manufacturer may guarantee that a process will manufacture good parts if the parts conform to the design rules, thus allowing the designers to begin integrated circuit designs many months before the manufacturing process is ready.

After the first production of a new integrated circuit design, there is generally a period of failure analysis as the design and manufacturing processes are adjusted to produce a successful product. The root cause failure analysis of some integrated circuits may be very time consuming, sometimes consuming days or even weeks to isolate a single fault on a chip.

The failure analysis techniques available to development engineers include mechanical probing, optical beam induced current (OBIC), optical beam induced resistive change (OBIRCH), picosecond imaging circuit analysis (PICA), light induced voltage alterations (LIVA), charge induced voltage alterations (CIVA), various scanning electron microscopy (SEM) techniques, and other techniques known in the art. In addition, destructive tests, such as etching and lapping, may be used to isolate and identify problems.

In many cases, the design of an integrated circuit may limit or prohibit certain techniques for ascertaining faults. For example, in order to probe a certain path using a laser technique, the path must not have another metal trace directly above the path of interest. Further, the various techniques may only isolate a problem within a certain section of the circuitry, but not to a specific trace or via.

During process development and verification, it is important that faults are isolated to an exact location. For example, a via may have very high resistivity. In order for the manufacturing process to be corrected, the location of the via must be identified exactly. Failure analysis techniques that isolate only a section of an electric path are not sufficient for the fine-tuning of the manufacturing process.

Memories can be self-timed circuits and the location of the fault in the memory array can be shown based on test program data logs. This is typically referred to as bit mapping. The bit mapping routines typically consume thousands of megabytes of tester memory and require many test pins to test. Memories typically only look at the first few layers or a process and do not have typical structures seen in analog circuits or in digital circuits.

Memories require expensive test platforms for testing due to the high tester pattern memory requirements and cannot look at all process layers or subsets of layers for yield and reliability. Memory structures are fixed and do not look like analog circuits or digital circuits and therefore suffer from the same yield or reliability issues. Commercially available fault tester systems such as PDF Solutions and KLA Microloop structures that use SEM or Optical inspection are very slow to test, cannot be used for reliability testing and increase the cycle time though manufacturing.

Failure analysis, particularly on 90 nm technologies and beyond is becoming extremely difficult. At-speed testing, which is the process of placing an application specific integrated circuit (ASIC) or interconnect module on a tester and running fault coverage and performance test patterns at the speed the part will run in the system, is becoming very important to the yield and reliability of products.

It would therefore be advantageous to provide a system and method for testing an integrated circuit manufacturing process wherein failure analysis techniques may be used to quickly isolate and locate a manufacturing defect and be fast enough to be utilized for reliability testing. It would further be advantageous if the system and method were able to stress the manufacturing process by operating at the design limits of the manufacturing process.

SUMMARY OF THE INVENTION

The present invention overcomes the disadvantages and limitations of the prior art by providing a system and method for evaluating an integrated circuit manufacturing process while dynamically testing performance with high-speed operational frequencies. An integrated circuit designed at many of the manufacturing process limits offers complete and fast failure analysis so that manufacturing defects can be quickly located and the process improved.

This invention incorporates a self-timed or gated speed circuit that can detect subtle resistive faults and also show the exact location in the array where the speed fault occurred based on test program datalogs from scan flip flops. One embodiment incorporates a gated clock in the gated speed circuit producing gated data that delivers greater statistical properties with respect to Integrated Circuit Direct Drain Quiescent Current (IDDQ) testing.

The present invention may therefore comprise a method of locating a fault within an array of integrated circuits comprising: establishing row propagation speeds for gated timing signals passed through a number of rows of serially connected interconnect modules of an array of serially connected interconnect modules; establishing a row reference propagation speed based upon the row propagation speeds; comparing the row propagation speeds individually to the row reference propagation speed to establish a row fault criteria; establishing column propagation speeds for gated timing signals passed through a number of columns of serially connected interconnect modules of the array of serially connected interconnect modules; establishing a column reference propagation speed based upon the column propagation speeds; comparing the column propagation speeds individually to the column reference propagation speed to establish a column fault criteria; generating a matrix of row and column fault conditions based upon the row and column fault criteria; and, locating the fault within the array of interconnect modules by utilizing the row and column fault conditions within the matrix that correspond to an array location.

The present invention may further comprise a speed fault test vehicle for locating a fault within an array of interconnect modules comprising: a first gated clock circuit with at least one layer comprising a number of rows of serially connected interconnect modules with row outputs and connected within an array of serially connected interconnect modules that establishes row propagation characteristics for each the row of serially connected interconnect modules; a second gated clock circuit with at least one layer comprising a number of columns of serially connected interconnect modules with column outputs and connected within the array of serially connected interconnect modules that establishes column propagation characteristics for each the column of serially connected interconnect modules; a level select circuit that allows serial input of one or more the row propagation characteristics or one or more the column propagation characteristics; a row scan flop logic circuit that receives the row propagation characteristics; a column scan flop logic circuit that receives the column propagation characteristics; a first comparator that compares the row propagation characteristics of each the row of serially connected interconnect modules to a reference row value, the comparison establishing a row fault criteria; a second comparator that compares the column propagation characteristics of each the column of serially connected interconnect modules to a reference column value, the comparison establishing a column fault criteria; a matrix of row and column fault conditions that is generated based upon one or more the layers of the row and column fault criteria; and, a fault location map generated by utilizing the layers of the row and column fault conditions within the matrix that correspond to array locations.

The advantages of the present invention are that an integrated circuit may be manufactured that stresses many of the design limits of the manufacturing process. Further, At-speed testing allows an engineer or technician to very quickly pinpoint the exact root cause and failure location and thereby quickly ascertain any improvements or changes that need to be made to the manufacturing process. Additionally, a manufacturing process may be monitored and verified by periodically manufacturing and testing the test vehicle. The test vehicle is a test chip that is used for design, evaluation reliability and manufacturing purposes and is utilized to validate a design before full commercialization. The present invention provides a test platform with less than 200 vectors and only uses 6 pins and, since the device is self-timed, it is not limited by tester clock speed. Therefore, an externally driven clock frequency does not limit the maximum frequency to the tester limit. Hence, the disclosed invention can detect subtle resistive defects.

A test vehicle with gated clock and gated data additionally provides the advantages of greater data and clock control with less scan logic and array logic power consumption. The vehicle also has less power droop, better statistical filtering capability on failures and IDDQ, and has the ability to test and process multiple layers within each array.

In addition, the test vehicle has very low tester memory requirements, very low pin count and very low pattern length. The interconnect modules are also programmable. Hence, on a statistical basis, each array can have one type of interconnect module. If one type of array fails more than another, then it can be determined that a particular interconnect module may be unreliable. Arrays may also be burned in for reliability testing.

DETAILED DESCRIPTION OF THE INVENTION

Figure 1:
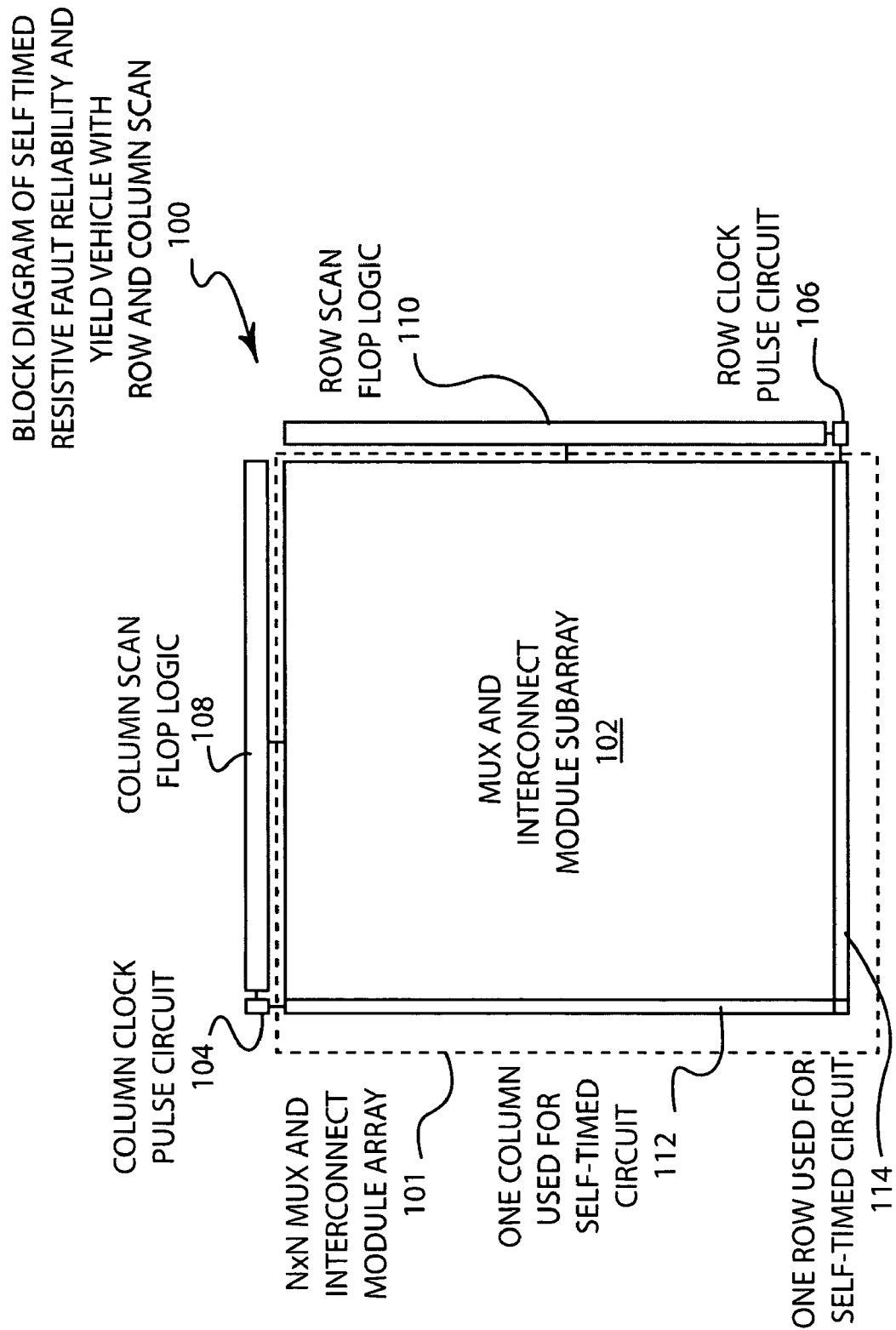
FIG. 1 is an illustration of an embodiment of a self-timed resistive fault test vehicle in which resistive fault reliability and yield are tested and failures located.

FIG. 1 illustrates an embodiment 100 of a self-timed resistive fault test vehicle in which resistive fault reliability and yield are tested and failures located for an integrated circuit. A column clock pulse circuit 104 receives a signal from the first column 112 of an N×N array of modulator (Mux) and interconnect modules 101. This first column acts as a self-timed circuit that can use a clock edge (usually from lower speed clock signal) and generate a pulse of a certain duration that is used to then time the speed of the other columns within the N×N mux and interconnect subarray 101 shown as the mux and interconnect subarray 102. This timed pulse is used to load the outputs of the other columns into the column scan flop logic 108 and discrepancies are registered. A signal registered in the column scan flop logic 108 that differs from the first column for self-timed circuit 112, indicates that there is an irregularity, fault or some type of error within that particular column.

Similarly, column clock pulse circuit 106 receives a signal from the first row 114 of an N×N array of modulator (Mux) and interconnect modules 101. This first row acts as a self-timed circuit that can use a clock edge (usually from lower speed clock signal) and generate a pulse of a certain duration that is used to then time the speed of the other rows within the N×N mux and interconnect subarray 101 shown as the mux and interconnect subarray 102. This timed pulse is used to load the outputs of the other columns into the column scan flop logic 110 and discrepancies are registered. A signal registered in the row scan flop logic 110 that differs from the first row for self-timed pulse 114, indicates that there is an irregularity, fault or some type of error within that particular row. By combining the information gathered from both the column scan flop logic 108 and the row scan flop logic 110 a matrix can be set up to determine the location of any interconnect modules that are not performing properly.

As shown in FIG. 1, data is transitioned into the first column used for self-timed circuit 112, a clock pulse is generated from the column clock pulse circuit 104 which then clocks the column scan flop logic 108. Additional columns of interconnects are tested in columnar fashion in the mux and interconnect subarray 102 and loads the parallel data from each column into the column scan flop logic 108. The first column signal is compared to each successive column signal in the associated scan flop logic register and analyzed for discrepancies. If all the interconnect modules are the same type of device, with the same capacitance and resistance, etc., the signals should all reach the column scan flop logic 108 at the same time and at a known delay from the first column self-timed circuit 112. Delays or discrepancies in this timing indicate an error in that particular column.

Similarly for the rows, data is transitioned into the first row used for self-timed circuit 114, a clock pulse is generated from the row clock pulse circuit 106 which then clocks the row scan flop logic 110. Additional columns of interconnects are tested in columnar fashion in the mux and interconnect subarray 102 and loads the parallel data from each row into the row scan flop logic 110. The first row signal is compared to each successive row signal in the associated scan flop logic register and analyzed for discrepancies. Again, if all the interconnect modules are the same type of device, with the same capacitance and resistance, etc., the signals should all reach the row scan flop logic 108 at the same time and at a known delay from the first row self-timed circuit 114. Delays or discrepancies in this timing indicate an error in that particular row. By associating the column and row error maps together, an exact location of all the errors in the interconnect modules can be obtained.

The self-timed resistive fault test vehicle 100 is an integrated circuit design that can be used to perform At-speed testing by placing an ASIC on a the test vehicle and running fault coverage and performance test patterns at the performance speed of the tested part. This test vehicle is also known as a speed fault circuit and can determine speed fault defects within the ASIC. These speed faults are failures within the ASIC that occur at the system speed or performance speed of the tested part, but are undetected At-speeds slower than the system speed due to a resistive defect in the ASIC. The interconnect modules tested by this method and device can include a wide variety of custom or industry standard components such as serpentine structures, comb structures, vias, stacked vias, unstacked vias, minimum design rules, subminimum design rules, greater than minimum design rules or the like.

This invention allows many test techniques to be used to identify and isolate errors within the interconnect array. In order to determine the exact root cause for a failure, it is desirable to locate the exact point where a failure occurred. If the fault is not isolated to a specific location, the manufacturing process cannot be as thoroughly checked and thus process development proceeds at a slower pace. This embodiment allows a process development engineer to produce a hard-to-manufacture design while giving the engineer a fast and reliable method of detection. By manufacturing a self-timed resistive fault test vehicle in which resistive fault reliability and yield are tested and failures located, a test sample may be produced at the limits of the manufacturing processes and is also quickly evaluated to pinpoint any failures, and therefore, may also be used for reliability testing of finished products.

Those skilled in the art may design a self-timed resistive fault test vehicle in which resistive fault reliability and yield are tested and failures located while keeping within the spirit and intent of the present invention. This application is related to U.S. Non-Provisional application Ser. No. 10/307, 018, entitled "FAILURE ANALYSIS VEHICLE," filed Nov. 27, 2002 by Richard Schultz and Steve Howard, the entire disclosure of which is herein specifically incorporated by reference for all that it discloses and teaches.

Figure 2A:
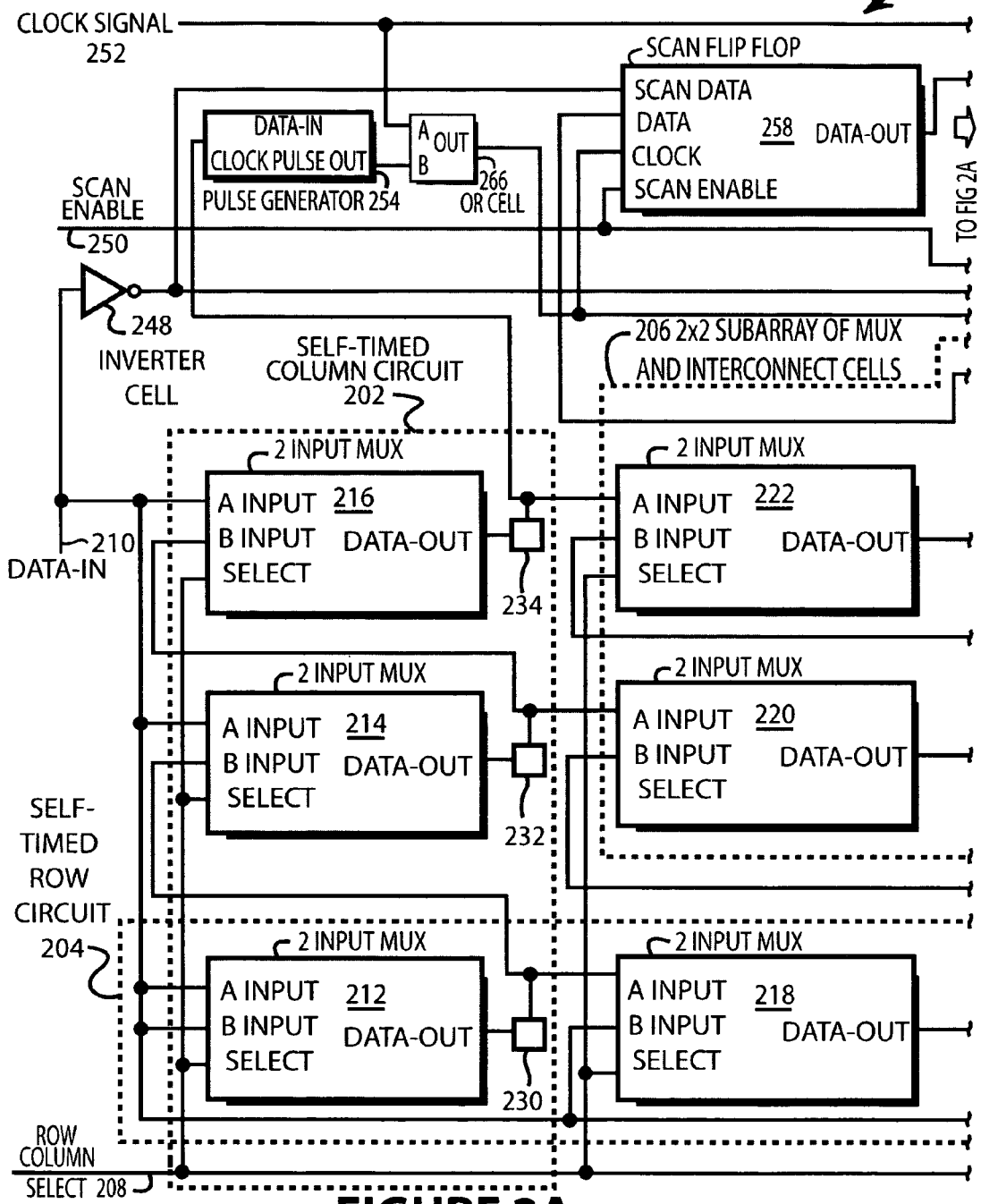
FIG. 2A and FIG. 2B are a schematic diagram of a self-timed resistive fault test vehicle in which resistive fault reliability and yield are tested and failures located.
Figure 2B:
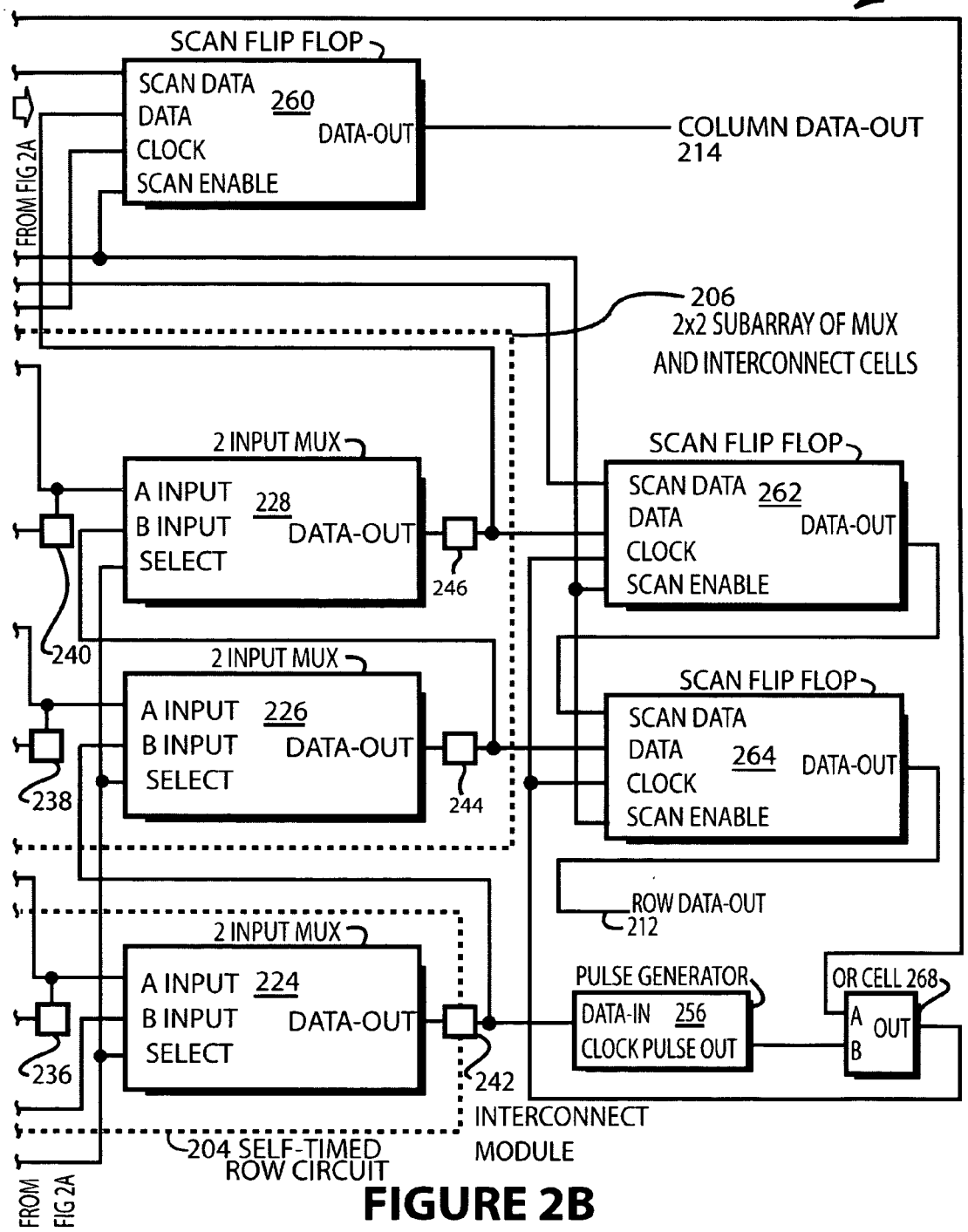

FIG. 2A and FIG. 2B illustrate a schematic representation of the self-timed resistive fault test vehicle 200 where resistive fault reliability and yield are tested and failures located. A large number of interconnect modules (as many as hundreds of thousands) can be subjected to At-speed testing within the self-timed speed circuit shown. Further detailing an example the test vehicle of FIG. 1, a 3×3 array of interconnect modules 230-246 is subjected to At-speed testing to determine faults and their corresponding location within the array. The array of interconnect modules 230-246 is laid out in rows and columns with each interconnect module 230-246 connected to a corresponding 2-input mux 212-228. The first column of muxes and interconnects, the self timed column circuit 202 direct their signal to the column clock pulse circuit (104 of FIG. 1) that includes a pulse generator 254 and an OR cell 266. The columns of muxes and interconnects within the mux and interconnect subarray 206 (102 of FIG. 1), direct their signal to the column scan flop logic circuit (108 of FIG. 1) comprising a series of scan flip flops 258-260, the number of which corresponds to N−1 in the N×N array. In this example N=3, therefore, there are 2 scan flip flops 258 and 260. The pulse generator 254, the OR cell 266, and the first column timing determine the total column timing and generate a clock pulse that serves as a reference for all other columns whose output is registered in the corresponding scan flip flop 258-260 for each column.

The first row of muxes and interconnects, the self timed row circuit 204 direct their signal to the row clock pulse circuit (114 of FIG. 1) that includes a pulse generator 256 and an OR cell 268. The rows of muxes and interconnects within the mux and interconnect subarray 206 (102 of FIG. 1), direct their signal to the row scan flop logic circuit (110 of FIG. 1) comprising a series of scan flip flops 262-264, the number of which corresponds to N−1 in the N×N array. In this example N=3, therefore, there are 2 scan flip flops 262 and 264. The pulse generator 256, the OR cell 268, and the first column timing determine the total row timing and generate a clock pulse that serves as a reference for all other rows whose output is registered in the corresponding scan flip flop 262-264 for each row.

The self-timed speed circuit is initiated with a signal at data-in 210 where the signal path splits to enter an inverter cell 248, the A input of each 2-input mux 212, 214, 216 of the self-timed column circuit 202, and the B input of each 2-input mux 214, 218, 224 of the self-timed row circuit 204. Vertical columns and horizontal rows of interconnect modules are tested separately on the same test vehicle by switching either A input or B input in the 2-input muxes 212-228 by triggering the row/column select toggle 208. In this example, the row/column select toggle 208 will be set to accept B data which will test columns of interconnects vertically in the array.

The data signal at data-in 210 will input a signal to the B input on the 2-input mux 212 in the self-timed column circuit 202, and transmit a signal from the data-out port on the mux 212. This signal is then transmitted to interconnect 230 whereupon the signal branches either vertically up the column (column toggle) or branches horizontally across the row (row toggle) and transmits its data signal to the next mux in a serial fashion. In this case the signal branches to the B input on the next mux in the column 214. The signal is similarly transmitted to interconnect 232 whereupon the signal branches vertically up the column (column toggle) and again transmits its data signal to the B input on the next mux in the column 216. Likewise, the signal is then transmitted to interconnect 234 whereupon the signal branches and transmits its data signal to the data-in port of the pulse generator 254.

The pulse generator 254 generates a clock pulse which is transmitted through the OR cell 266 and is received by the clock input on the scan flip flops 258 and 260. Therefore, the delay through the self-timed column circuit 202 is being used to generate a pulse which clocks the flip flops 258 and 260. Concurrently, each of the other columns are running vertically as well. The signal at data-in 210 will input a signal to the B input on each of the self-timed row circuit muxes 212, 218 and 224, and similarly to the self-timed column circuit, the signals will be propagated vertically upward through the rest of the columns. The 2-input mux 218 transmits a signal from the data-out port to interconnect 236 whereupon the signal branches vertically up the column (column toggle) and transmits its data signal to the next mux 220 in the column in a serial fashion. The signal is similarly transmitted to interconnect 238 branched vertically up the column and again transmits its data signal to the B input on the next mux in the column 222. The signal is then transmitted to interconnect 240 whereupon the signal branches and transmits its data signal to the data-in port of the scan flip flop 258. Identical paths follow for each vertical column in the subarray 206.

If each interconnect module 236, 238, 240 is working properly in that particular column (similarly for each of the other columns in the subarray 206), the signal arriving at the data-in port of the scan flip flop 258 should precede the signal arriving at the clock in port of the scan flip flop 258 from the OR cell 266 by a known amount of time dependant upon the clock pulse out timing of the pulse generator 254. The entire delay can be calculated from the timing of the data-in 210 signal passing through an inverter cell 248 and proceeding directly to the scan data port of the scan flip flop 258. Each of the column scan flip flops is triggered to be in scan mode by a scan enable toggle 250 that is received by each of the scan flip flops 258, 260,262 and 264. As stated, if all interconnect modules in the columns are working properly, the data reaches each column flip flop 258 and 260 at the same time. At this point the flop flops receive a clock pulse signal 252 via the B input port of the OR cell 266 and the data is loaded into the flip flops 258 and 260 in a non-scan mode, thus, the scan enable signal 250 is not triggered allowing a parallel load into the flip flops 258 and 260. Once the self-timed circuit has finished, the scan enable 250 is triggered and the clock signal 252 is used to clock the scan box and scan the data out serially through the column data-out 214.

Summarizing, data is transitioned into the speed circuit with one column of the array being utilized as the self-timed circuitry. The self-timed column delay is used to parallel load the data from each column into the column shift registers by generating a clock pulse from the clock pulse generator circuit 254 which travels through the OR cell 266 which then clocks the flip flops 258 and 260 and loads all the parallel data from each column in the subarray 206. Then data is no longer transitioned in, and the scan enable signal 250 is triggered from low to high and the external clock 252, at a much lower frequency, the data is then scanned out through the column data-out 214. Since the data is loaded into the shift registers in parallel and serially scanned out, the data can be evaluated by looking at the failing test vectors. The location of the failure for a row and column correspond to that array location.

The horizontal rows work in a similar fashion. If the column select toggle 208 is set to accept A data it tests rows of interconnects horizontally in the array. The data signal at data-in 210 inputs a signal to the A input on the 2-input mux 212 in the self-timed row circuit 204, and transmit a signal from the data-out port on the mux 212. This signal is then transmitted to interconnect 230 whereupon the signal branches either vertically up the column (column toggle) or branches horizontally across the row (row toggle) and transmits its data signal to the next mux in a serial fashion. In this case the signal branches to the A input on the next mux in the row 218. The signal is similarly transmitted to interconnect 236 whereupon the signal branches horizontally across the row (row toggle) and again transmits its data signal to the A input on the next mux in the row 224. Likewise, the signal is then transmitted to interconnect 242 whereupon the signal branches and transmits its data signal to the data-in port of the pulse generator 256.

The pulse generator 256 generates a clock pulse which is transmitted through the OR cell 268 and is received by the clock input on the scan flip flops 264 and 262. Therefore, the delay through the self-timed row circuit 204 is generating a pulse that clocks the flip flops 264 and 262. Concurrently, each of the other rows in the subarray 206 are running horizontally as well. The data signal at data-in 210 will input a signal to the A input on each of the self-timed row circuit muxes 212, 214 and 216, and similarly to the self-timed row circuit, the signals are propagated horizontally across through the rest of the rows. The 2-input mux 214 transmits a signal from the data-out port on the mux 212 to interconnect 232 whereupon the signal branches horizontally across the row (row toggle) and transmits its data signal to the next mux 220 in the row in a serial fashion. The signal is similarly transmitted to interconnect 238 branched horizontally across the row and again transmits its data signal to the A input on the next mux in the row 226. The signal is then transmitted to interconnect 244 whereupon the signal branches and transmits its data signal to the data-in port of the scan flip flop 264. Identical paths follow for each horizontal row in the subarray 206.

If each interconnect module 232, 238, 244 is working properly in that particular row, (similarly for each of the other rows in the subarray 206), the signal arriving at the data-in port of the scan flip flop 264 should precede the signal arriving at the clock in port of the scan flip flop 264 from the OR cell 268 by a known amount of time dependant upon the clock pulse out timing of the pulse generator 256. The entire delay can be calculated from the timing of the data-in 210 signal passing through an inverter cell 248 and proceeding directly to the scan data port of the scan flip flop 256. Each of the row scan flip flops is triggered to be in scan mode by a scan enable toggle 250 that is received by each of the scan flip flops 258, 260, 262 and 264. As stated, if all interconnect modules in the rows in the subarray 206 are working properly, the data reaches each row flip flop 264 and 262 at the same time. At this point the flop flops receive a clock pulse signal 252 via the A input port of the OR cell 268 and the data is loaded into the flip flops 264 and 262 in a non-scan mode, thus, the scan enable signal 250 is not triggered allowing a parallel load into the flip flops 264 and 262. Once the self-timed circuit has finished, the scan enable 250 is triggered and the clock signal 252 is used to clock the scan box and scan the data out serially through the row data-out 212.

Summarizing, data is transitioned into the speed circuit with one row of the array being utilized as the self-timed circuitry. The self-timed row delay is used to parallel load the data from each row into the row shift registers by generating a clock pulse from the clock pulse generator circuit 256 that travels through the OR cell 268 which then clocks the flip flops 264 and 262 and loads all the parallel data from each row in the subarray 206. Then data is no longer transitioned in, and the scan enable signal 250 is triggered from low to high and the external clock 252, at a much lower frequency, the data is then scanned out through the row data-out 212. Since the data is loaded into the shift registers in parallel and serially scanned out, the data can be evaluated by looking at the failing test vectors. The location of the failure for a row and column correspond to that array location.

In an alternative embodiment, a delay may be added with a delay cell after the pulse generator circuit 254, 256 and the OR cell 266, 268, so that the clock pulse will arrive at a later time. This could be done if the test vehicle needs more time to allow for the columns signal to register the data. Typically, the propagation from the pulse generator circuit and the OR cell you should create sufficient delay, but if the array is very large, there is more variability and such compensation may be necessary.

Figure 3:
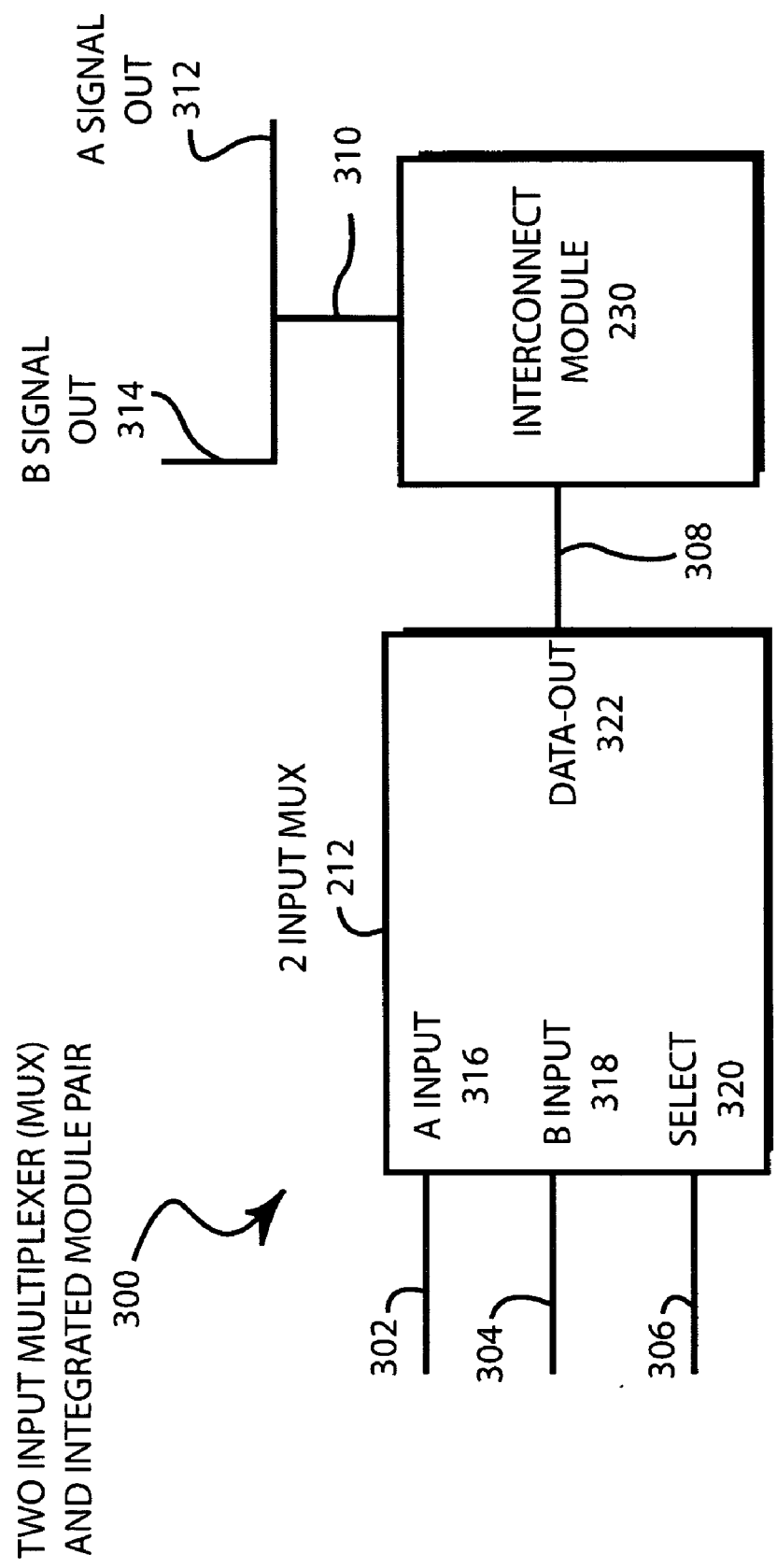
FIG. 3 is a schematic diagram of a two input multiplexer and interconnect module pair of the self-timed resistive fault test vehicle illustrated in FIG. 2A and FIG. 2B.

FIG. 3 illustrates an embodiment of the present invention with a schematic representation of a two input multiplexer and interconnect module pair of the self-timed resistive fault test vehicle of illustrated in FIG. 2A and FIG. 2B. This detail illustrates the workings of the two input mux 212 and its interaction with the individual interconnect module 230. As a signal is input to the mux 212, a select input 306 is triggered with an external row/column select signal 208 (shown in FIG. 2) that specifies utilizing either the row A input port 316 and the respective A input signal 302, or the column B input port 318 and the respective B input signal 304. Either input signal is transmitted by the data-out port 322 of the input mux 212 to the interconnect module 230 via path 308. The interconnect module 230 receives and outputs the signal. If the row/column select signal is triggered to row A input port 316, then the output signal 310 directs the A signal out 312 and the path is directed serially along the entire row of mux and interconnect module pairs. If the row/column select signal is triggered to column B input port 318, then the output signal 310 directs the B signal out 314 and the path is directed serially along the entire column of mux and interconnect module pairs.

In a typical embodiment, the mux and interconnect module pair circuit 300 may be connected end to end many times, possibly hundreds or thousands of times in a single integrated circuit. In a typical manufacturing process, the failure rate for interconnect modules or other integrated circuit components during process development may be in the range of 1:100,000 or higher. Thus, it may be useful to have circuits with at least 100,000 or 1,000,000 interconnect modules that are easily analyzed for failures. The manufacturing process is stressed by having to manufacture a very high number of interconnect modules or other difficult-to-manufacture features.

With each clock cycle, data must simultaneously propagate through the rows or columns of mux and interconnect module pairs. If a problem exists within one of the many interconnect modules, the data will not propagate properly and will become corrupted. Such problems become more apparent when the clock speeds are high. The present embodiment, when tested at high speeds, will detect more subtle resistive changes between elements and may be a more thorough test of the manufacturing process.

In different embodiments, the string of mux and interconnect module pairs 300 may be of different lengths and the number of flip flops may also be different. For example, when many mux and interconnect module pairs are used, the propagation times will be high and thus the clock speeds will be lower. Such an example may be useful when the available test equipment may not be fast enough to test shorter strings of and interconnect modules. Other embodiments may be created by those skilled in the arts that incorporate other test circuits while maintaining within the spirit and intent of the present invention.

Figure 4:
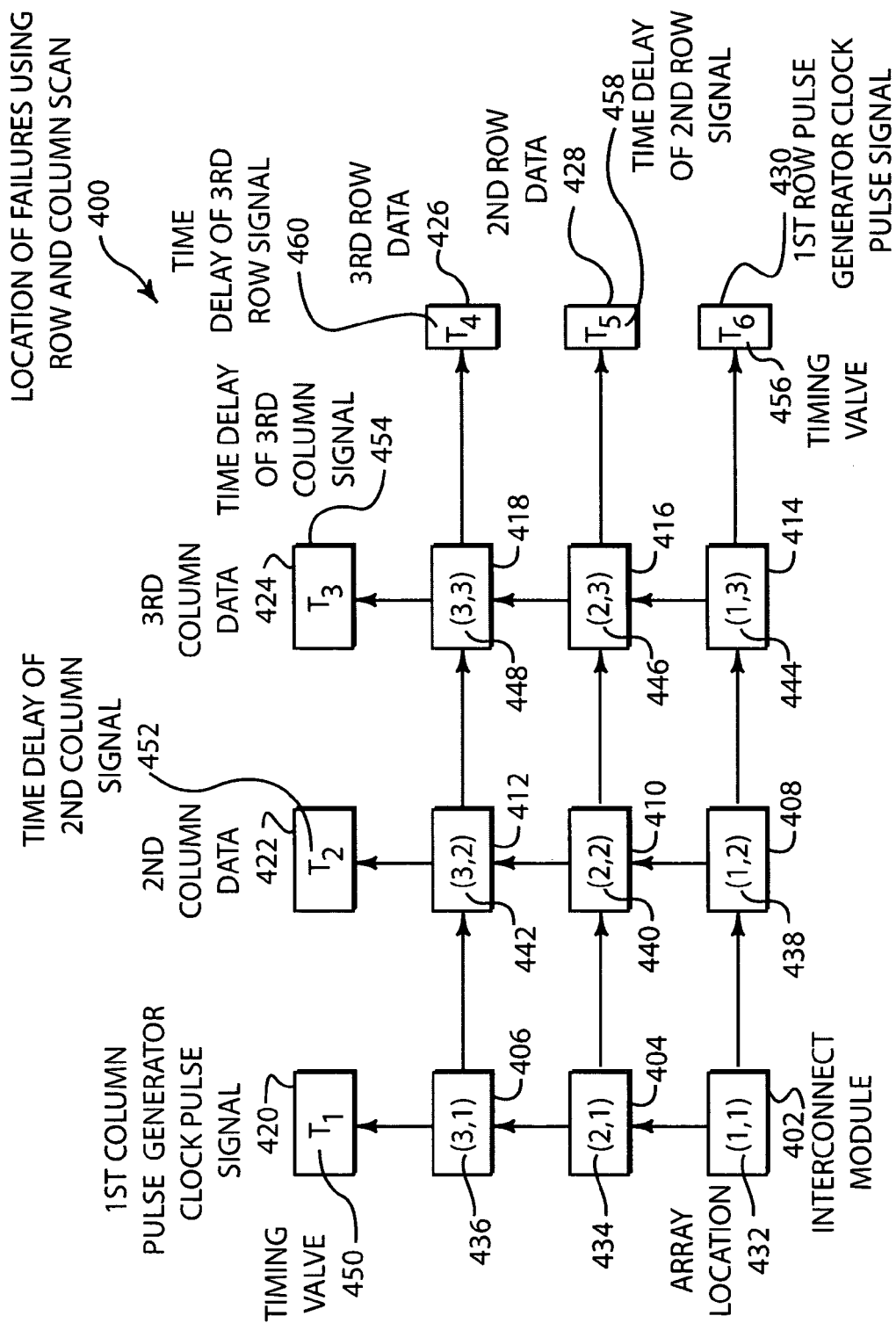
FIG. 4 is an illustration of a graphic representation of the self-timed resistive fault test vehicle described in FIG. 2A and FIG. 2B.

FIG. 4 illustrates an embodiment of the present invention with a graphic representation of the self-timed resistive fault test vehicle illustrated in FIG. 2A and FIG. 2B. This detail demonstrates the ability to locate and isolate an individual interconnect module that is not functioning properly. As shown in FIG. 4, 2-input mux and interconnect pair circuits 402-418 are laid out in linear rows and columns of a 3×3 array for testing. By assigning a 2-dimentional matrix layout to the interconnect module array, we can place an array location assignment to each component based upon its row and column position. The array location 432-448 of each of the interconnect pair circuits 402-418 is denoted as (X, Y) coordinates. The timing value 450 of the first column is indicated in the first column pulse generator clock pulse signal 420. This timing value 450 is compared to the time delay of the second column signal 452 in the second column data register 422 and to each successive column signal of each successive column data register.

Similarly, the timing value 456 of the first row is indicated in the first row pulse generator clock pulse signal 430. This timing value 456 is compared to the time delay of the second row signal 458 in the second row data register 428 and to each successive row signal of each successive row data register. Discrepancies between the timing of the column and row signal propagation times are easily read in these registers and outlying times indicate an error in that particular row or column. For example, a column scan indicating a time delay $T_2$ in the second column signal 452, that is for instance, twice that of the other columns and the anticipated time would indicate an error in one of the column 2 components or structures. A successive row scan indicating a time delay $T_5$ in the second row signal 458, that is for instance, twice that of the other rows and the anticipated time would indicate an error in one of the row 2 components or structures. This then indicates that the component delivering improper timing to the test vehicle is located at (2,2) 440 and is interconnect module 410.

Therefore one row and one column of the array are used as the self-timed circuitry. The self-timed column delay is used to parallel load the data from each column into the column shift registers. The self-timed row delay is used to parallel load the data from each row into the row shift registers. Since the data is loaded into the shift registers in parallel and serially scanned out, the data can be evaluated by looking at the failing test vectors. The location of the failure for a row and column correspond to that array location. This invention provides a wide degree of diversity because the programmable interconnect modules can be filled with a wide variety of metal combs or serpentines, via chains, library cells, active combs and serpentines etc. Since the data from all columns is parallel loaded in to shift registers, it can be serially shifted out to an external test pin. Similarly, since the data from all rows is parallel loaded in to shift registers, it too can be serially shifted out to an external test pin. The invention provides a test vehicle in which the data can flow vertically or horizontally through the array. This provides for very low test memory and vector requirements. The number of vectors needed for test is equal to two times the row height plus the column height. For example an array of muxes 50×50 would result in approximately 200 test vectors. This is the amount of vectors needed to serially scan out the data from the shift registers. In one test pass, the device would feed all 1's to the array (parallel load and serial scan out) and then all 0's to the array (parallel load and serial scan out). For this particular embodiment, only 4 input pins, 2 output pins, 1 power and 1 ground pin are needed. In an additional embodiment, the two output pins could be combined into 1 output pin by tying the two shift registers together.

Figure 5:
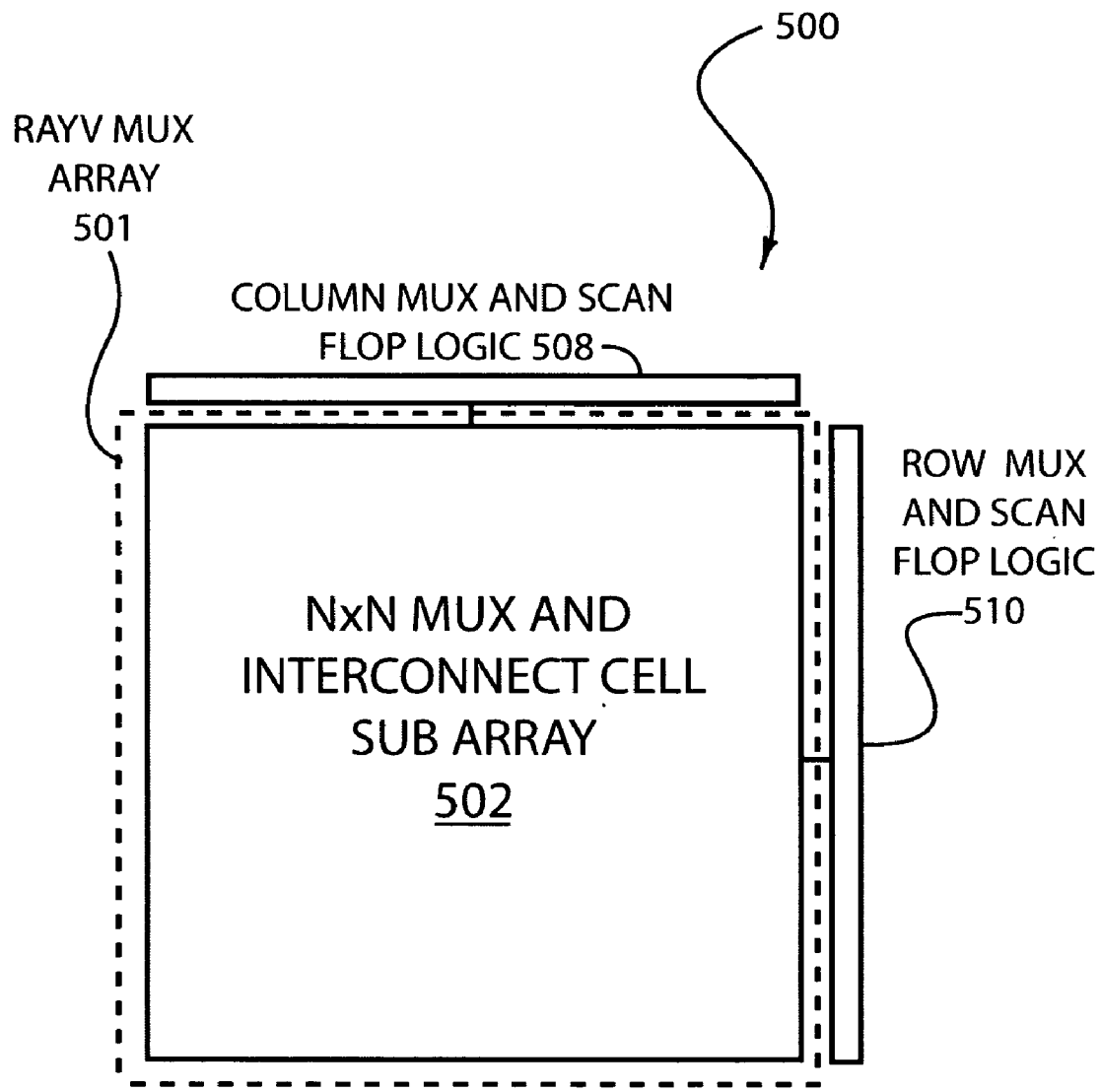
FIG. 5 is an illustration of an embodiment of a gated test vehicle in which resistive fault reliability and yield are tested and failures located.

FIG. 5 illustrates an embodiment of a gated test vehicle in which resistive fault reliability and yield are tested and failures located for an integrated circuit. In a similar manner to the layout described in FIG. 1, a Reliability And Yield Vehicle (RAYV) mux array 501 is made up of an N×N mux and interconnect cell subarray 502. A gated clock pulse is used in the current embodiment for the column mux and scan flop logic 508. Additionally, a gated clock pulse which is independently controllable is used for the row mux and scan flop logic 510.

A gated clock pulse creates a gated data signal with a parallel loading of columns or rows in the RAYV mux array 501. Comparisons are made within successive columns or rows to look for discrepancies and outliers. These comparisons can be accomplished with references being determined by proximity or by more advanced statistical methods such as timing averages that can be used to compare the speed of the other columns or rows within the N×N mux and interconnect cell subarray 502. These data pulses are loaded into the column mux and scan flop logic 508 for column data and to row mux and scan flop logic 510 for row data and discrepancies are registered. A signal registered in this column scan flop logic that differs from a reference column, indicates that there is an irregularity, fault or some type of error within that particular column. Similarly, an independently controllable gated clock pulse creating a signal registered in the row mux and scan flop logic 510 that differs from a reference row, indicates that there is an irregularity, fault or some type of error within that particular row. By combining the information gathered from both the column mux and scan flop logic 508 and the row mux and scan flop logic 510 a matrix can be set up to determine the location of any interconnect modules that are not performing properly.

By gating clock and data, the test vehicle will only clock either the column mux and scan flop logic 508, which captures the column data when a column data signal is sent, or the test vehicle will only clock the row mux and scan flop logic 510, which captures the row data when a row data signal is sent, and therefore, the testing power is cut in half. The power supply lines for the array logic will have less power droop more accurate row and column timing sensitivity. The reduced power and peak current will give greater test control and allow the use of the Precision Measuring Units (PMU) that inherently have a greater degree of accuracy than the power supplies of conventional test units. The use of PMU"s will for example, allow the testing of 32 arrays simultaneously rather than independently or one at a time. This will dramatically reduce the test time and wear and tear on a probe card used in the test process. Because the PMU"s can source 100 mA and can have a 1 nF capacitance maximum without oscillating, the peak current that the PMU can source is limited.

This configuration also permits data to be sent to multiple layers on an array at the same time which allows detection of faults caused by unwanted interaction between these multiple layers that are placed on different power supplies. With this embodiment, more detailed IDDQ testing is now possible since the data can be driven (or gated) at each process layer under test. Additionally this design can detect functionally and with IDDQ whether there is unwanted layer to layer fault interaction that can be statistically removed from the analysis.

Figure 6A:
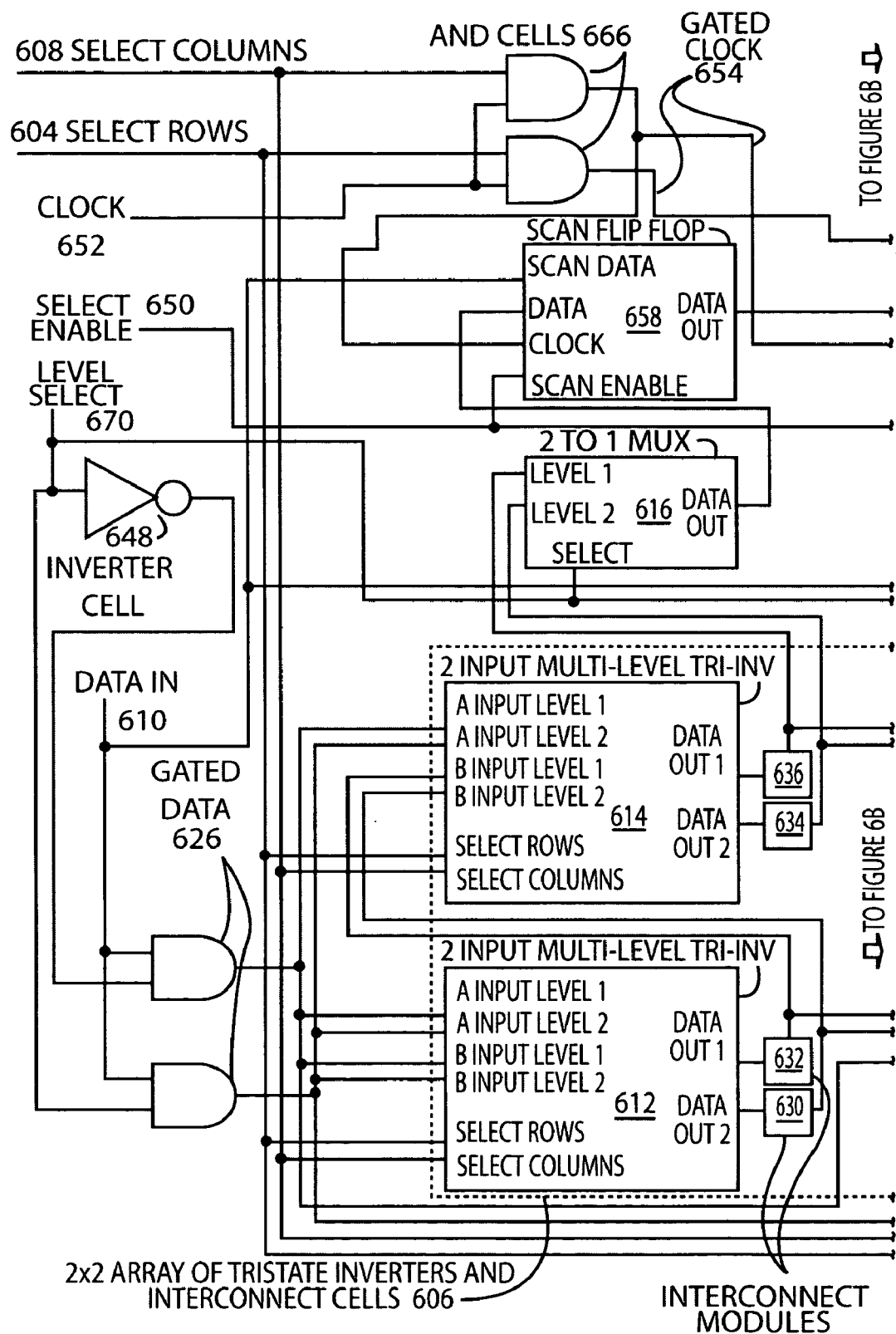
FIG. 6A and FIG. 6B are a schematic diagram of a gated test vehicle in which resistive fault reliability and yield are tested and failures located.
Figure 6B:
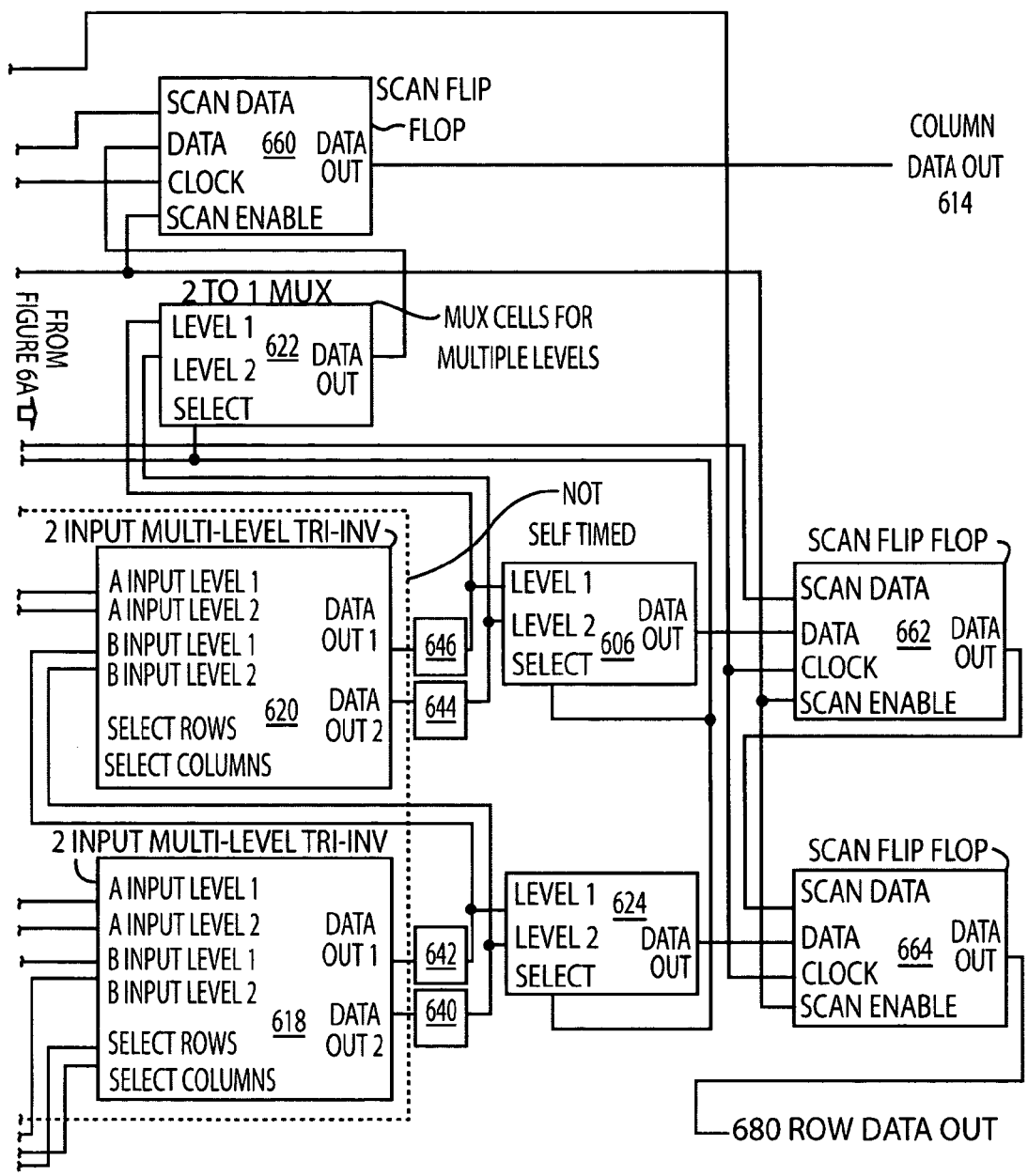

FIG. 6A and FIG. 6B illustrate a schematic representation of a gated test vehicle in which resistive fault reliability and yield are tested and failures located. A large number of interconnect modules (as many as hundreds of thousands) can be subjected to at-speed testing within the gated speed circuit shown. Further detailing an example the test vehicle of FIG. 5, a 2×2 array of tristate inverters and interconnect cells 606 is subjected to at-speed testing to determine faults and their corresponding location within the array. The array of tristate inverters and interconnect modules 606 is laid out in rows and columns with each interconnect module connected to a corresponding 2-input multi-level tri-inv 612, 614, 618, 620 and interconnect modules 630-636 and 640-646. The signal path and register scan of the test vehicle are set by a series of inputs that determine row, column, layer etc., which a test signal will undertake. Column or row selection is performed with a select column 608 and a select row 604 input that drive AND cells 666 as well as an input selector on each of the 2-input multi-level tri-inv 612, 614, 618 and 620. This selection determines whether rows or columns will be tested for this instance.

Select enable 650 input is used to set the scan flip flops 658, 660, 662 and 664 either into a parallel load or a serial scan out mode. For example, when select enable 650 is set high, the scan flip flops 658, 660, 662 and 664 are placed in a serial scan out mode. When select enable 650 is set low, the scan flip flops 658, 660, 662 and 664 are placed in a parallel load. As column data is being accumulated, the circuit is in a parallel load, and the system will load data from the column into the scan flops. Similarly, switching to a serial scan out would sequentially shift register the data out. This prevents the vehicle from getting column and row data at the same time and allows an operator to execute a parallel load and then look at the results from that parallel load. This data may be analyzed one clock cycle at a time as column data out or row data out. It also enables the vehicle to test the scan flops before a parallel load is performed while verifying that the scan logic is working before the array is tested.

A level select 670 input controls the 2 to 1 MUX 616, 622, 624 and 606, enabling the test vehicle to test each level within a multiple level array. Level select 670 additionally feeds an inverter cell 648 that directly feeds into the gated data 626 which controls which level the data is sent to. Thus, within the array only one level will toggle at a time and additionally cutting down on the power demand of the system. Data in 610 is used to send data to specific cells in columns and rows and at different levels depending on the status of the select enable 650, the level select 670, the select column 608 and a select row 604.

A clock 652 is used in conjunction with the data in 610. Data is input at data in 610, and at a later predetermined period of time, the clock 652 is toggled. This known delay will vary the period when transition data which goes through the columns or rows ends up at the scan flop and when the clock pulse is received acting as a timing search. For example, the vehicle can use this timing search in a functional mode where the delay is very long allowing all rows and columns ample signal processing time to detect functional defects. Particular faults such as resistive faults may show up later, and by doing a timing search, this delay can be quantified. This gives the ability to clock the data or not clock the data versus time thereby characterizing some types of faults by using very long delays as well as timing related faults by doing a timing search. A resultant fault map can be created by correlating timing data to row and column data and bitmapping.

As in a similar manner to the embodiment detailed in FIG. 1, a first column of tristate inverters and interconnects 612-614 and 630-636 direct their signal to the scan flip flop 658 for their column. The column scan flop logic circuit comprises a series of scan flip flops 658-660, the number of which corresponds to N in the N×N array. In this example N=2, therefore, there are 2 column scan flip flops shown 658 and 660. Connecting the tristate inverters and interconnects 612-614, 618-620 and 630-646 with the column scan flip flops 658-660, is a 2 to 1 MUX 616 and 622 acting as a switching mechanism that enables the test vehicle to test each level within a multiple level array. In a similar manner, the first row of tristate inverters and interconnects 612, 618 and 630-632, 640-642 direct their signal to the scan flip flop 664 for their row. The row scan flop logic circuit likewise comprises a series of scan flip flops 662-664, the number of which corresponds to N in the N×N array. In this example N=2, therefore, there are 2 row scan flip flops shown 664 and 662. Connecting the tristate inverters and interconnects 612-614, 618-620 and 630-646 with the row scan flip flops 662-664, is a 2 to 1 MUX 606 and 624 also acting as a multiple level switching mechanism.

For example, the gated circuit is initiated with a signal at data-in 610 where the signal travels to the A input of the 2-input multi-level tri-inv 612 and 614 of the row circuit when select rows 604 is selected, and the B input of the 2-input multi-level tri-inv's 612 and 618 of the column circuit when select columns 608 is selected. Multiple levels of row and column circuits may be tested by selection with the level select 670 input. Whereas the current embodiment illustrates a two level row and column platform for demonstrative purposes, any number of levels can be executed in a similar manner. Vertical columns and horizontal rows of interconnect modules are tested separately and independently on the same test vehicle by this switching.

The data signal at data-in 610 will input a signal will be gated at the gated data 626 and transmitted to the 2×2 array of tristate inverters and interconnect cells 606. For example a B input on the 2-input multi-level tri-inv 612 in the column circuit transmits a signal from the data-out port to an interconnect (630 or 632) each corresponding to the level being tested. This signal is then transmitted either vertically up the column (column select) or branches horizontally across the row (row select) and transmits its data signal to the next 2-input multi-level tri-inv in a serial fashion. In this case the signal branches to the B input on the next 2-input multi-level tri-inv 614 in the column. The signal is similarly transmitted to an interconnect (either 634 or 636 depending upon the level select 610) whereupon the signal transmits its data signal to the 2 to 1 mux 616 and registers in the scan flip flop 658. Concurrently, each of the other columns is running vertically as well with signals being propagated vertically upward through the rest of the columns.

If each tristate inverters 612-614 and interconnects 630-636 is working properly in that particular column (similarly for each of the other columns in the subarray 606), the signal arriving at the data port of the scan flip flop 658 will arrive with correct data properties and timing. At this point, the scan enable on the scan flip flop is triggered and data is serially exported through the column data-out 614. The row data is similarly created, registered and serially exported through the row data-out 680.

The two-input multi-level tri-inverters used in the embodiment detailed in FIG. 6 allow the N×N array to transmit data horizontally and vertically. The inverter is either tri-stated, meaning it's an open circuit and that it does not allow that level to transition through, or there are two tri-state inverters connected together. In this condition only one component is allowing data to pass through at a time and the other component goes through a high impedance state or an open circuit state. This allows a row and column selection which allows data from that particular row or column to pass through. When data transitions horizontally through the array 606 and the select row 604 input is high, the column multi-level tri-inv are tri-stated or open preventing data from being transmitted vertically. Likewise, when data transitions vertically through the array 606 and the select column 608 input is high, the row multi-level tri-inv are tri-stated or open preventing data from being transmitted horizontally.

Previous embodiments (FIGS. 1-4) are self-timed circuits so the test is either pass or fail and timing information is unavailable. In the current embodiment (FIGS. 5 and 6) a gated clock is introduced. By utilizing a gated clock and gated data in the array, the timing resolution of the test vehicle is dramatically increased. This is accomplished by gating the data in into the circuit and using the gated clock pulse as a separate timing circuit to provide reference. Additionally the row and column data are generated and read independently which reduces the power driving these features by one half. This feature is combined with the ability to test multiple layers of circuitry and ultimately produce a three dimensional report or mapping of the array. By analyzing row and column data in a matrix as was detailed with the vehicle of FIG. 1, the performance of specific components can be detailed. The addition of multi-level capability allows for a multi-tier matrix which further enhances the capability and resolution of the test vehicle. Overall the disclosed RAYV produces greater data and clock control with less scan logic and array logic power consumption. The vehicle also has less power droop, better statistical filtering capability on failures and IDDQ and has the ability to test and process multiple layers within each array.

The various embodiments are useful for the development and verification of integrated circuit manufacturing processes. In a typical use, one of the embodiments would be designed using target design parameters for a new manufacturing process. Such design parameters may include At-speed performance characteristics of the interconnect modules. An embodiment may be manufactured into an integrated circuit using the new manufacturing process. Any problems with the integrated circuit are quickly isolated to the exact interconnect module where the problem exists.

The problems can then be traced back to the specific process, reticule, or other manufacturing issue as necessary. When the process is able to produce one or more of the embodiments of the present invention without creating any faults, the process may be certified and mass production may begin.

The embodiments may be further useful for verifying existing manufacturing processes. For an established manufacturing process, it may be desirable to periodically produce one of the various embodiments to evaluate any problems with the manufacturing process and to verify proper operation.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method of locating a fault within an array of integrated circuits comprising:
   establishing row propagation speeds for gated timing signals passed through a number of rows of serially connected interconnect modules of an array of serially connected interconnect modules;
   establishing a row reference propagation speed based upon said row propagation speeds;
   comparing said row propagation speeds individually to said row reference propagation speed to establish a row fault criteria;
   establishing column propagation speeds for gated timing signals passed through a number of columns of serially connected interconnect modules of said array of serially connected interconnect modules;
   establishing a column reference propagation speed based upon said column propagation speeds;
   comparing said column propagation speeds individually to said column reference propagation speed to establish a column fault criteria;
   generating a matrix of row and column fault conditions based upon said row and column fault criteria; and,
   locating said fault within said array of interconnect modules by utilizing said row and column fault conditions within said matrix that correspond to an array location.

2. The method of claim 1 wherein said step of establishing row propagation speeds for gated timing signals passed through a number of rows of serially connected interconnect modules of an array of serially connected interconnect modules further comprises:
   aligning said number of rows of serially connected interconnect modules substantially parallel with a first axis.

3. The method of claim 1 wherein said step of establishing column propagation speeds for gated timing signals passed through a number of columns of serially connected interconnect modules of said array of serially connected interconnect modules further comprises:
   aligning said number of columns of serially connected interconnect modules substantially parallel to a second axis that is substantially perpendicular to said first axis.

4. The method of claim 1 further comprising the step of:
   applying a row select signal input into said array of interconnect modules to switch a data-in signal path only through said rows of said array of interconnect modules.

5. The method of claim 1 further comprising the step of:
   applying a column select signal input into said array of interconnect modules to switch a data-in signal path through said columns of said array of interconnect modules.

6. The method of claim 1 further comprising the step of:
   registering said row propagation speeds for said rows of serially connected interconnect modules of said subarray with a row scan flop logic circuit.

7. The method of claim 6 wherein said step of registering said row propagation speeds for said rows of serially connected interconnect modules of said subarray with said row scan flop logic circuit further comprises:
   driving a row clock circuit with a gated clock and generating a gated row clock signal to load data from said row scan flop logic circuit.

8. The method of claim 7 further comprising the step of:
   varying said gated row clock pulse signal so that said row clock pulse will arrive at a predetermined time.

9. The method of claim 1 further comprising the step of:
   registering said column propagation speeds for said columns of serially connected interconnect modules of said subarray with a column scan flop logic circuit.

10. The method of claim 9 wherein said step of registering said column propagation speeds for said columns of serially connected interconnect modules of said subarray with said column scan flop logic circuit further comprises:
    driving a column clock circuit with a gated clock and generating a gated column clock signal to load data from said column scan flop logic circuit.

11. The method of claim 10 further comprising the step of:
    varying said gated column clock pulse signal so that said column clock pulse will arrive at a predetermined time.

12. The method of claim 1 wherein said row reference propagation speed is established for a particular row by said row propagation speeds within physical proximity of said particular row.

13. The method of claim 1 wherein said row reference propagation speed is established for a particular row by statistical methods performed on one or more row propagation speeds of said rows of serially connected interconnect modules.

14. The method of claim 1 wherein said column reference propagation speed is established for a particular column by said column propagation speeds within physical proximity of said particular column.

15. The method of claim 1 wherein said column reference propagation speed is established for a particular column by statistical methods performed on one or more column propagation speeds of said column of serially connected interconnect modules.

16. The method of claim 1 wherein said method of locating a fault within an array of integrated circuits process is repeated on multiple layers of said arrays of serially connected interconnect modules.

17. The method of claim 16 further comprising the step of:
    generating a layer matrix of said row and said column fault conditions based upon said row and column fault criteria for each said layer of said arrays of serially connected interconnect modules; and,
    locating a fault within said three-dimensional array of interconnect modules by utilizing two or more said layer matrix of said row and said column fault conditions.

18. A method of testing an array of interconnect modules comprising:
    providing a speed fault reliability and yield test vehicle, said test vehicle comprising:
    a first gated clock circuit with at least one layer comprising a number of rows of serially connected interconnect modules with row outputs connected within an array of serially connected interconnect modules, a second gated clock circuit with at least one layer comprising a number of columns of serially connected interconnect modules with column outputs connected within said array of serially connected interconnect modules, a level select circuit that allows input from one or more said row outputs or one or more said column outputs, a row scan flop logic circuit that receives said row outputs of said rows of serially connected interconnect modules from said level select circuit and loads data in a parallel manner from each row into row shift registers, a column scan flop logic circuit that receives said column outputs of said columns of serially connected interconnect modules from said level select circuit and loads data in a parallel manner from each column into column shift registers, a row select switch and a column select switch input into said first gated clock circuit, said second gated clock circuit that switches the path of said data-in signal either through said rows of said array of interconnect modules or through said columns of said array of interconnect modules, a gated clock signal that clocks said column scan flop logic circuit to output data through a column data-out signal output when said column select signal is selected or clocks said row scan flop logic circuit to scan data out through a row data-out signal output when said row select signal is selected, a select enable input to reset said row and column scan flop logic circuits and allow input of a data-in signal, said data-in signal that is input into said array of interconnect modules, said data signal traveling through and registering propagation timing through either said rows or said columns of said array of interconnect modules, a row data-out signal output from said row shift registers when said data-in signal is transmitted through said rows of said interconnect modules, said row data-out signal containing propagation timing of each said row of said interconnect modules, a column data-out signal output from said column shift registers when said data-in signal is transmitted through said columns of said interconnect modules, said column data-out signal containing propagation timing of each said column of said interconnect modules;

applying a signal to either said row select input or said column select input;

applying a signal to a level select input of said level select circuit;

applying a first select enable signal to said select enable input;

applying a first clock signal to said clock signal input applying a first data-in signal to said data-in input;

reading a row data signal from said row data-out output;

applying a second scan enable signal to said scan enable input;

applying a second clock signal to said clock signal input applying a second data-in signal to said data-in input;

reading a column data signal from said column data-out output;

determining if said row and column data is within specification by comparing said row and column data output to expected values;

locating a failure on said test vehicle by utilizing row and column output data that is not within said specification to form an error matrix array, wherein said error matrix array correspond to said rows and columns of said array of interconnect modules; and, determining said row and column data and creating said error matrix array for each said layer of said array of serially connected interconnect modules to form a dimensional error array map of said interconnect modules.

19. A speed fault test vehicle for locating a fault within an array of interconnect modules comprising:

a first gated clock circuit with at least one layer comprising a number of rows of serially connected interconnect modules with row outputs and connected within an array of serially connected interconnect modules that establishes row propagation characteristics for each said row of serially connected interconnect modules;

a second gated clock circuit with at least one layer comprising a number of columns of serially connected interconnect modules with column outputs and connected within said array of serially connected interconnect modules that establishes column propagation characteristics for each said column of serially connected interconnect modules;

a level select circuit that allows serial input of one or more said row propagation characteristics or one or more said column propagation characteristics;

a row scan flop logic circuit that receives said row propagation characteristics;

a column scan flop logic circuit that receives said column propagation characteristics;

a first comparator that compares said row propagation characteristics of each said row of serially connected interconnect modules to a reference row value, said comparison establishing a row fault criteria;

a second comparator that compares said column propagation characteristics of each said column of serially connected interconnect modules to a reference column value, said comparison establishing a column fault criteria;

a matrix of row and column fault conditions that is generated based upon one or more said layers of said row and column fault criteria; and, a fault location map generated by utilizing said layers of said row and column fault conditions within said matrix that correspond to array locations.

20. The device of claim 19 wherein said number of rows of serially connected interconnect modules is substantially parallel has a first axis and said number of columns of serially connected interconnect modules is substantially parallel to a second axis that is substantially perpendicular to said first axis.

21. The device of claim 19 wherein a row/column select signal input into said array of interconnect modules is used to switch a data-in signal path either through said rows of said array of interconnect modules or said columns of said array of interconnect modules.

22. The device of claim 19 wherein a gated row clock pulse signal is varied so that a row clock pulse will arrive at said a row scan flop logic circuit at a predetermined time.

23. The device of claim 19 wherein a gated column clock pulse signal is varied so that a column clock pulse will arrive at said a column scan flop logic circuit at a predetermined time.

24. The device of claim 19 wherein said reference row value is established for a particular row by said row propagation characteristics within physical proximity of said particular row of serially connected interconnect modules.

25. The device of claim 19 wherein said reference row value is established for a particular row by statistical methods performed on one or more row propagation characteristics of said rows of serially connected interconnect modules.

26. The device of claim 19 wherein said reference column value is established for a particular column by said column propagation characteristics within physical proximity of said particular column of serially connected interconnect modules.

27. The device of claim 19 wherein said reference column value is established for a particular column by statistical methods performed on one or more column propagation characteristics of said columns of serially connected interconnect modules.

28. A speed fault test vehicle for locating a fault within an array of interconnect modules comprising:

a first gated clock circuit with at least one layer comprising a number of rows of serially connected interconnect modules and with row outputs connected within an array of serially connected interconnect modules that establishes row propagation characteristics for each said row of serially connected interconnect modules;

a second gated clock circuit with at least one layer comprising a number of columns of serially connected interconnect modules and with column outputs connected within said array of serially connected interconnect modules that establishes column propagation characteristics for each said column of serially connected interconnect modules;

a level select circuit that allows serial input of one or more said row outputs or one or more said column outputs;

a row scan flop logic circuit that receives said row outputs of said rows of serially connected interconnect modules from said level select circuit and loads data in a parallel manner from each row into row shift registers;

a column scan flop logic circuit that receives said column outputs of said columns of serially connected interconnect modules from said level select circuit and loads data in a parallel manner from each column into column shift registers;

a row select switch and a column select switch input into said first gated clock circuit, said second gated clock circuit of interconnect modules that switches the path of said data-in signal either through said rows of said array of interconnect modules or through said columns of said array of interconnect modules a gated clock signal that clocks said column scan flop logic circuit to output data through a column data-out signal output when said column select signal is selected or clocks said row scan flop logic circuit to scan data out through a row data-out signal output when said row select signal is selected;

a select enable input to reset said row and column scan flop logic circuits and allow input of a data-in signal, said data-in signal that is input into said array of interconnect modules, said data signal traveling through and registering propagation timing through either said rows or said columns of said array of interconnect modules;

a row data-out signal output from said row shift registers when said data-in signal is transmitted through said rows of said interconnect modules, said row data-out signal containing propagation timing of each said row of said interconnect modules; and, a column data-out signal output from said column shift registers when said data-in signal is transmitted through said columns of said interconnect modules, said column data-out signal containing propagation timing of each said column of said interconnect modules.

* * * * *